United States Patent [19]
Harris et al.

[11] Patent Number: 4,791,390
[45] Date of Patent: Dec. 13, 1988

[54] MSE VARIABLE STEP ADAPTIVE FILTER

[75] Inventors: Richard W. Harris, Bountiful; Frank A. Bishop; Glen D. Rattlingourd, both of Salt Lake City, all of Utah

[73] Assignee: Sperry Corporation, Blue Bell, Pa.

[21] Appl. No.: 394,488

[22] Filed: Jul. 1, 1982

[51] Int. Cl.[4] ..................... H03H 15/00; H03H 17/04
[52] U.S. Cl. .................... 333/166; 333/17 R; 333/174; 364/725; 364/724.17; 364/724.19; 375/16
[58] Field of Search ............... 333/167, 165, 166, 174, 333/17 R, 138–140; 364/725, 724; 375/11–16

[56] References Cited
U.S. PATENT DOCUMENTS 4,038,536  7/1977  Feintuch ........................ 333/166 X
4,052,559  10/1977  Paul et al. ........................ 333/166
4,238,746  12/1980  McCool et al. ................. 333/174 X
4,349,889  9/1982  van den Elzen et al. .......... 364/724

Primary Examiner—Marvin L. Nussbaum
Attorney, Agent, or Firm—John B. Sowell; L. J. Marhoefer; T. J. Scott

[57] ABSTRACT

A very rapidly converging adaptive filter which uses a variable scale factor for each weight of the filter. The value of the variable scale factor is chosen for each iteration and is based upon the sign changes of the incremental weight change. The variable scale factor exhibits large values when no sign changes occur and smaller values when sign changes occur. The new filter provides considerable improvement in increase of convergence rate and decrease in residual errors even in the presence of heavy noise while requiring only a modest increase in hardware.

29 Claims, 8 Drawing Sheets

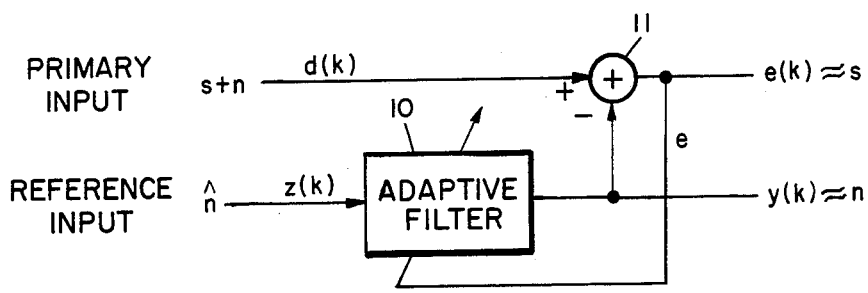
FIG. 1 ADAPTIVE FILTER NOISE CANCELLER (ANC)
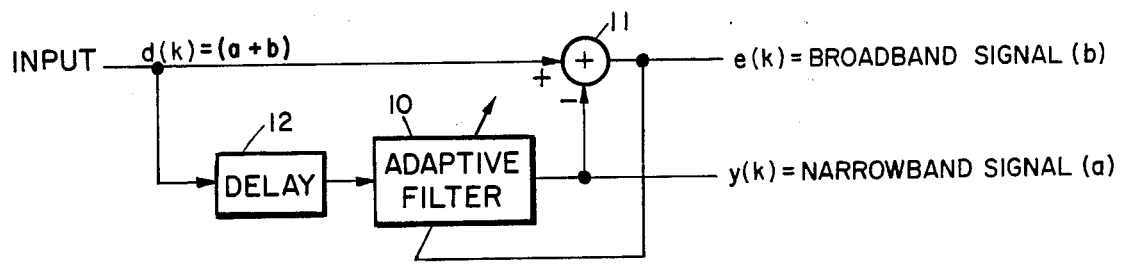
FIG. 2 ADAPTIVE FILTER LINE ENHANCER (ALE)
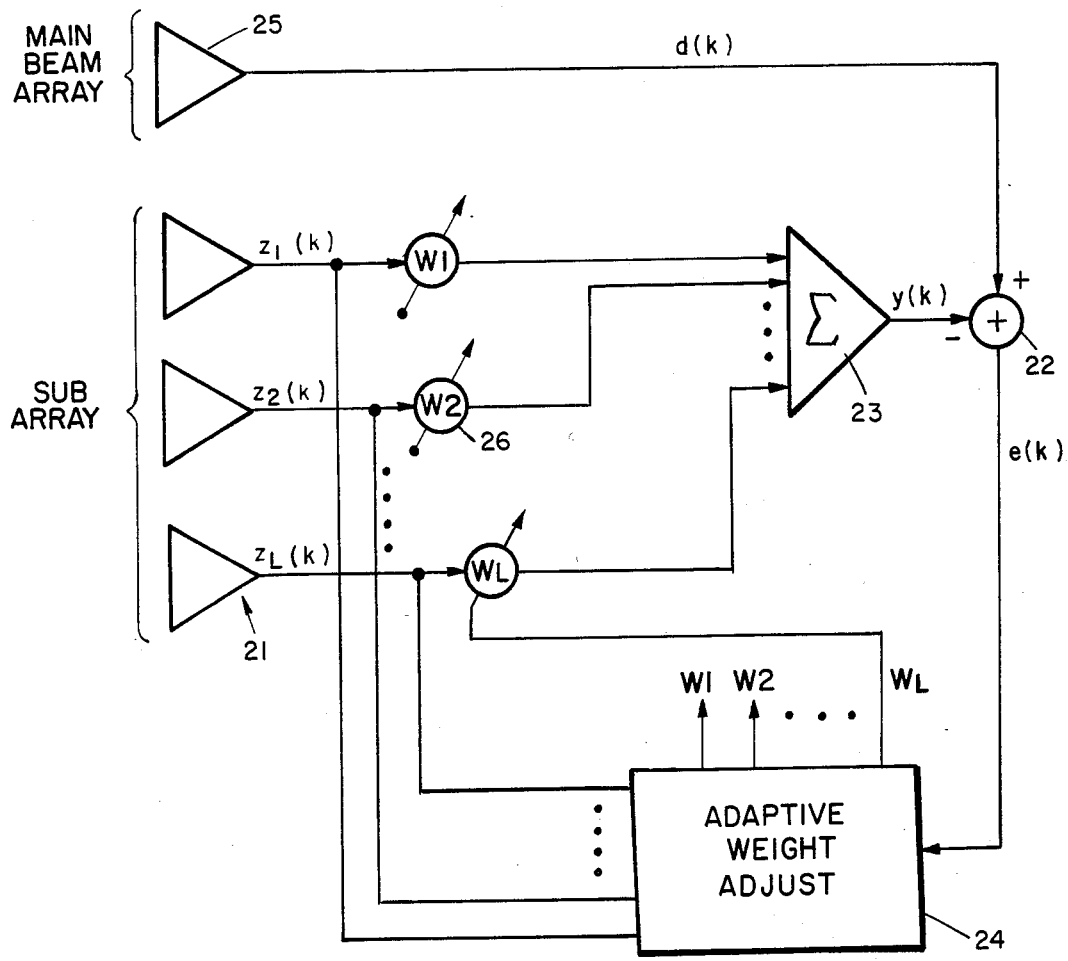
FIG. 3 ADAPTIVE ANTENNA ARRAY

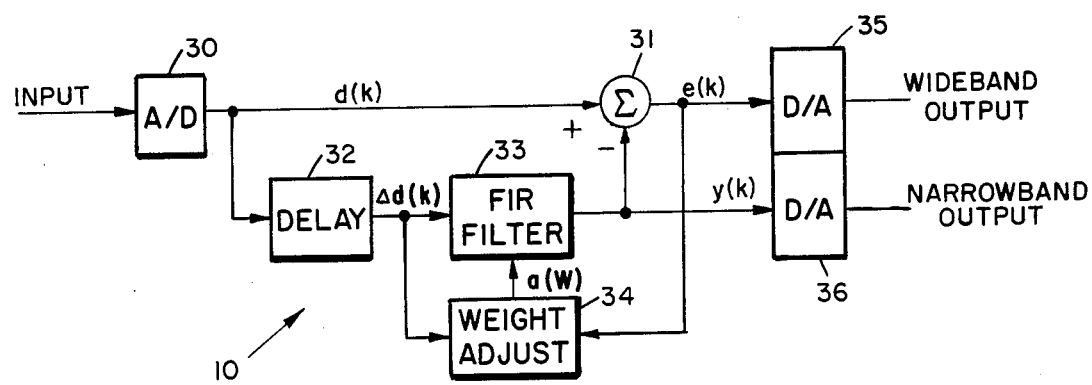
FIG. 4  DIGITAL ADAPTIVE FILTER ENHANCER (AFLE) USING AN FIR
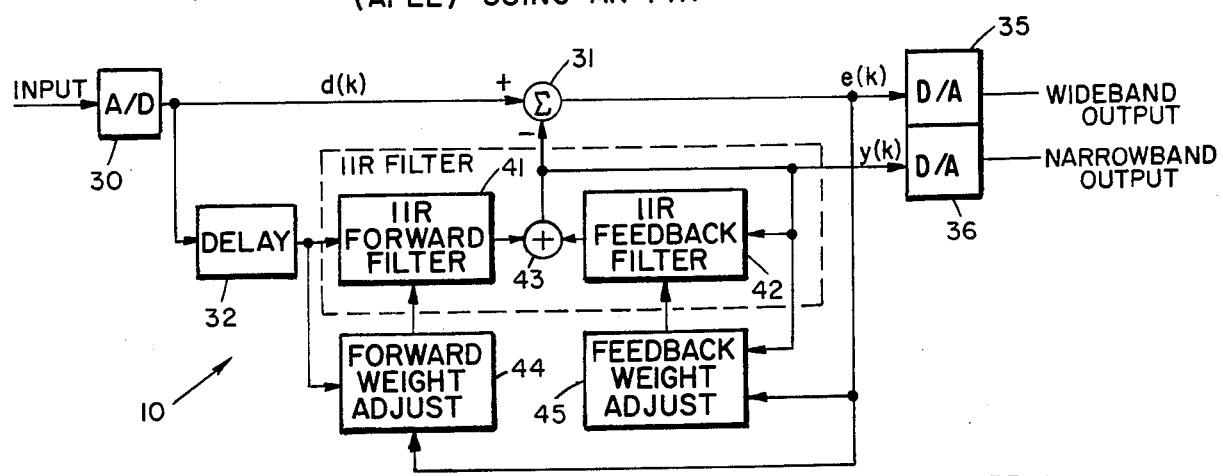
FIG. 5  DIGITAL ADAPTIVE FILTER LINE ENHANCER (AFLE) USING AN IIR
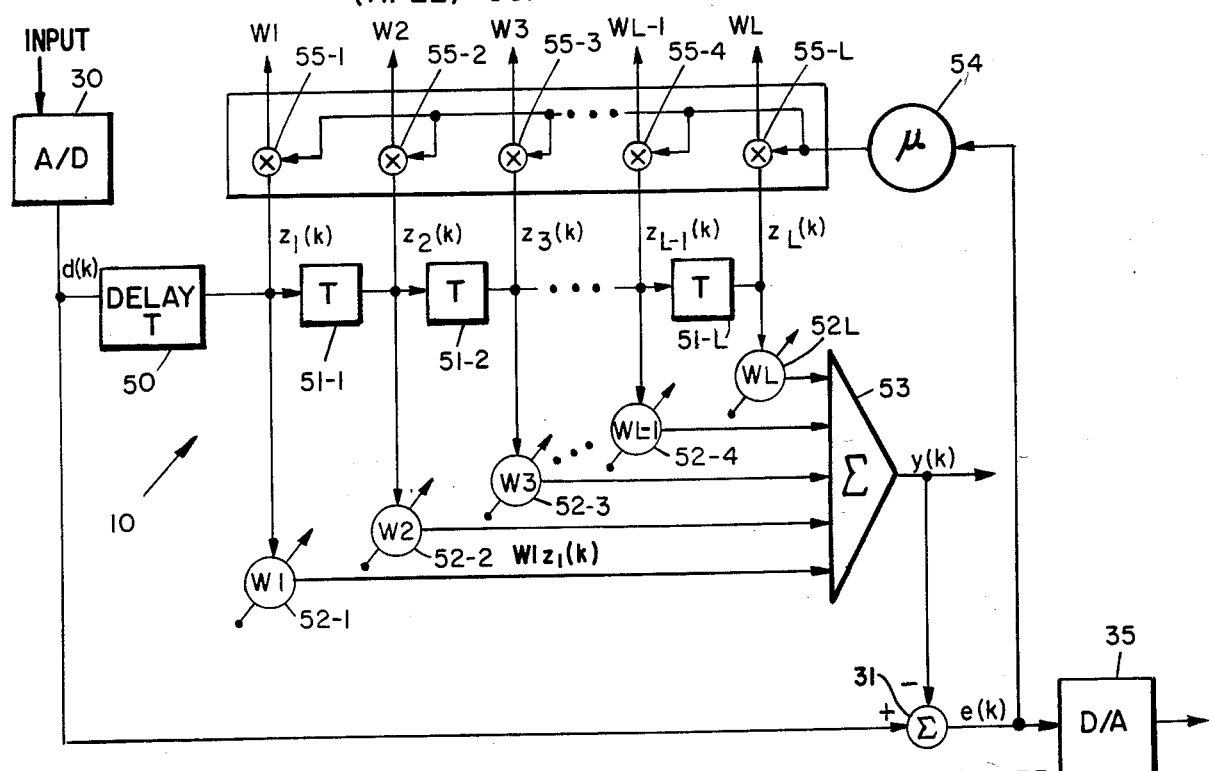
FIG. 6  DIGITAL ADAPTIVE FILTER LINE ENHANCER USING AN FIR

MSE VARIABLE STEP ADAPTIVE FILTER

BACKGROUND

1. Field of the Invention

This invention is directed to adaptive filters and adaptive arrays, in general, and to an adaptive filter or adaptive array having significantly improved operating characteristics, in particular.

2. Prior Art

There are many types of adaptive filters and adaptive arrays known in the art. These adaptive filters and adaptive arrays can be used in a number of applications such as in noise cancellation, line enhancement and sidelobe cancellation or the like. Typically, the noise canceller application of an adaptive filter is used in order to separate a primary signal from a noise signal. The input signal which comprises both the desired signal and the noise signal is applied to a circuit and a reference input signal is supplied thereto as well. The filter is operative to effectively subtract, or remove, the reference (or noise) signal from the primary input signal, thereby leaving only the desired signal as an output. The output signal is returned to the adaptive filter portion to alter the operation thereof so that an improved output signal is provided. The most important prior art applications use the so-called LMS (east Mean Square) algorithm to control the operation of the adaptive filter. Other algorithms have been proposed but are, generally, very expensive in hardware or have poorer performance in terms of convergence rate or residual error. Moreover, some of the proposed algorithms or techniques are of marginal utility. Most of the known devices exhibit poor performance in terms of the convergence rate or the residual error.

In the case of the line enhancer, a single input signal including desirable and undesirable components is provided. The reference input signal for the adaptive filter input is derived by delaying the input signal thereby decorrelating narrow band and wide band signals. The output signal from of the adaptive filter is then combined with the input signal to produce an error signal which is returned to the adaptive filter for alteration of the operating characteristics thereof to enhance the narrow band signal at the adaptive filter output which is then subtracted from the input signal to produce an enhanced broadband output signal.

In the case of the adaptive antenna, two major input signals are provided. One input is the output of the main antenna array which contains the signal and an unwanted noise or jamming signal. The other input is an independent or reduced directivity input in which the unwanted-noise-to-desired-signal ratio is much greater than the jamming-to-signal ratio in the main beam. The error signal is formed by subtracting the unwanted noise from the main signal plus noise. This error signal is used to adjust the weights $W_1, \ldots, W_L$ such that the error signal power is minimized. This minimization insures that the unwanted noise (or jamming signal) has been removed from the main signal channel to the maximum possible extent.

In the prior art devices, the algorithm which operates on the error signal and intermediate filtered signals to permit convergence on the minimum signal is undesirably slow. Contrariwise, if a relatively rapid convergence is desired and selected, the residual error is frequently relatively large and beyond the desired limits. Thus, relatively slow operation permits a rather accurate convergence and a relatively low residual error, while rapid convergence produces a large residual error. The tradeoffs in terms of time and accuracy are significant.

It is also known to use finite impulse response filters (FIR) or infinite impulse response adaptive filters (IRR). However, it is typically found that the convergence on the IIR filter is extremely slow when there is a high nose factor (i.e., low signal-to-noise ratio). That is, these filters are limited by the fact that low residual error is desirable which, typically, requires a low convergence rate.

PRIOR ART STATEMENT

The most pertinent prior art known to Applicants is listed herewith.

U.S. Pat. No. 4,238,746; ADAPTIVE LINE ENHANCER; by Mc Cool et al. This patent shows an adaptive line enhancer for spectral line enhancing using a weighted technique with a single scale factor.

U.S. Pat. No. 4,243,935; ADAPTIVE DETECTOR; by Mc Cool et al. This patent shows an adaptive linear prediction filter with tap weights which are adjustable by a single scale factor.

The devices described in these patents have the serious shortcoming that they can be adjusted by only a single scale factor for all weights. This single scale factor for all weights does not allow efficient performance in terms of convergence rate and residual error.

SUMMARY OF THE INSTANT INVENTION

This invention is directed to adaptive processing networks. The networks which include the instant adaptive filter circuit design are generally of the type known in the art. However, the adaptive filter circuit and technique described herein uses a variable scale factor for each weight of the adaptive filter circuit. This permits a more detailed and precise control of the adaptive filter. In addition, the adaptive filter of this invention alters the variable scale factor, in terms of size, as a function of the sign changes detected. Thus, large scale changes in the filter weighting can be achieved until sign changes indicate that a relative minimum in mean square error has been detected. The scale factor is then reduced and the filter operation continues. When the sign changes occur again, the scale factor can be further reduced. In this manner, rapid convergence can be achieved while, at the same time, minimizing the residual error. Moreover, by noting the number of sign changes (or not), large scale factor changes can be made to speed up the operations.

BRIEF DESCRIPTION OF THE DRAWINGS

FIGS. 1 through 5 are block diagrams of typical adaptive filter networks.

FIG. 6 is a schematic illustration of one type of adaptive filter circuit which is known in the prior art.

DESCRIPTION OF A PREFERRED EMBODIMENT

Figure 7:
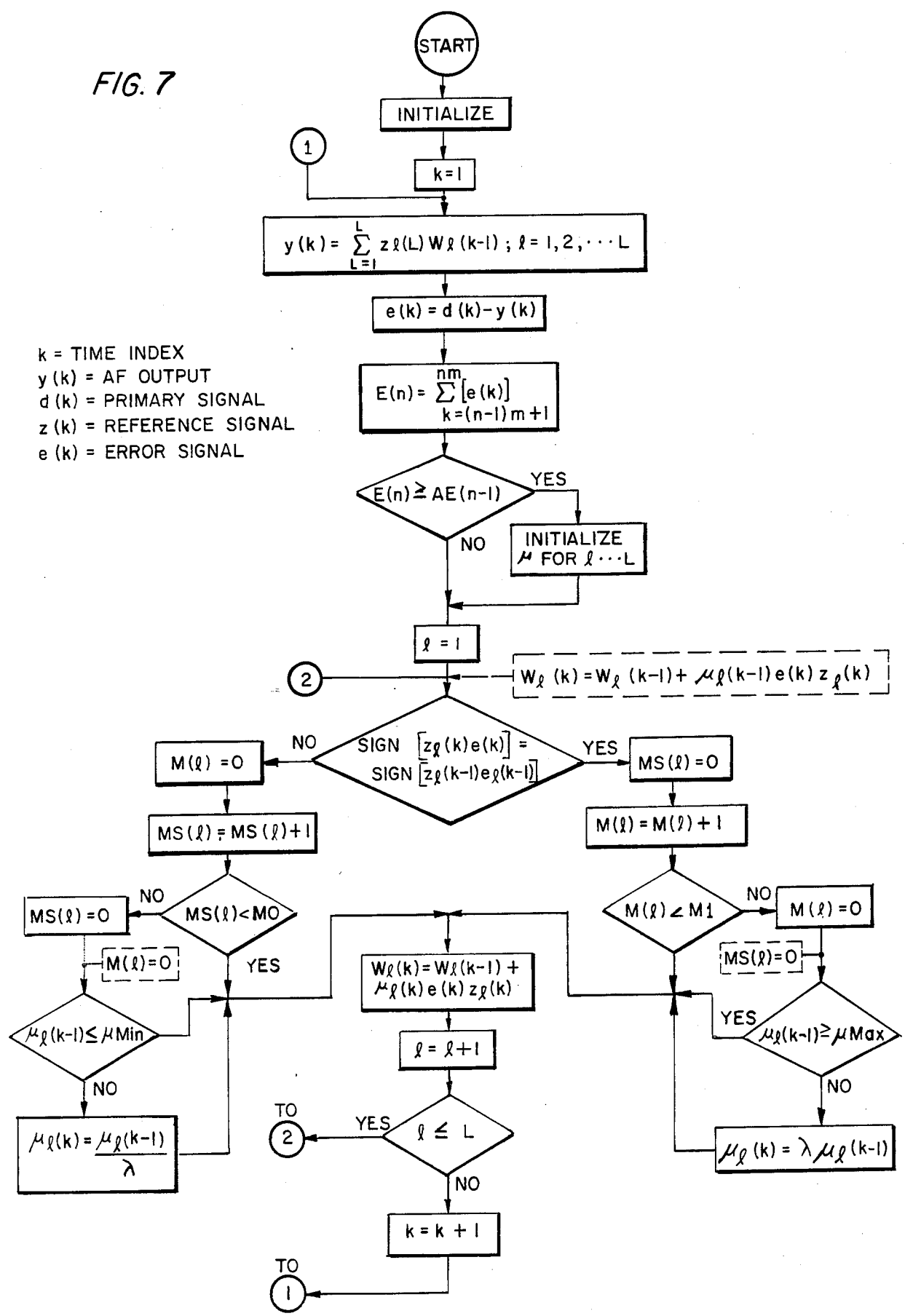
FIG. 7 is a flow chart showing the operation of the adaptive filter of the instant invention.

Typical adaptive filter networks known in the art are shown in FIGS. 1 and 2. The adaptive noise canceller (ANC) and adaptive line enhancer (ALE) are depicted, respectively.

In the adaptive noise canceller (FIG. 1), a primary input signal which comprises both signal and noise is supplied to the circuit. The primary input signal is referred to as $d(k)$ and is supplied to a combining circuit 11 which can be either a subtractor (or an algebraic adder where one of the inputs has been negated). A reference signal which is defined to represent the noise portion of the primary input signal is supplied directly to the adaptive filter 10. The reference signal is referred to as $z(k)$. The output of the adaptive filter 10 is applied to the combining circuit 11 and, as well, to an output terminal to produce an output signal referred to as $y(k)$. The output of combining circuit 11 is connected to an output terminal and supplies the error signal $e(k)$. In addition, the error signal $e(k)$ is returned to the adaptive filter 10 in order to selectively alter the operating characteristics thereof in order to minimize the amplitude of the error signal.

In a similar manner, an input signal $(a+b)$ comprising the sum of both broad band (b) and narrow band (a) signals is supplied to the adaptive line enhancer circuit shown in FIG. 2. This input signal is preferred to as $d(k)$ and is supplied to the input of combining network 11 and an input of delay network 12. The output of delay network 12 is connected to the input of adaptive filter 10 which can be of similar configuration to adaptive filter 10 of FIG. 1. The output of adaptive filter 10 is again connected to an output terminal to provide the signal $y(k)$ which, after adaptation, becomes the narrow band signal (a). The output signal of adaptive filter 10 is further supplied to the combining network 11, to be combined with the input signal. Combining network 11 (an algebraic adder) produces the output (error) signal $e(k)$ which is the broad band signal (b). This signal $e(k)$ is also returned to adaptive filter 10 to alter the operating characteristics thereof.

Referring now to FIG. 3, there is shown an adaptive antenna array. The main array signal plus unwanted noise is received as $d(k)$ by the main beam array 25 and supplied to the combiner 22. An independent or reduced directivity input signal $Y(k)$ is provided by a separate antenna or antenna sub-array 21. Sub-array reference signals $z_1(k)$ $z_L(k)$ are modified by adjustable weights 26, i.e. $w_1$ through $w_L$, and combined in the summation circuit 23 to produce the total output signal of the sub-array $y(k)$. The combiner 22 takes the difference between $d(k)$ and $y(k)$ to produce an error signal $e(k)$ which is supplied to the adaptive weight adjust circuit 24. Operating on the error signal $e(k)$ and the sub-array signals, the adaptive weight adjust circuit adjusts the weights $w_1$ through $W_L$ to minimize the error signal power. This process minimizes the unwanted noise in the error signal and produces a more noise-free main signal from the array.

Referring now to FIG. 4, there is shown a digital adaptive line enhancer (ALE) using a finite impulse response (FIR) filter 33. In this instance, the input signal is an analog signal which is supplied to an input of analog-to-digital converter 30. The A/D converter 30 supplies the $d(k)$ signal to delay network 32 and to combiner circuit 31. Delay network 32 supplies signal to the weight adjust circuit 34, as well as to the FIR filter 33. The weight adjust circuit 34 also supplies a signal to the FIR filter 33. The output of FIR filter 33 is supplied to another input of combiner circuit 31 and to an input of digital-to-analog converter 36. The output of combiner circuit 31 is connected to an input of weight adjust circuit 34 and to an input of digital-to-analog converter 35.

The operation of the circuit shown in FIG. 4 is similar to the operation of the circuit shown in FIG. 3 with the greater specificity that the weight adjust circuit 34 is shown as a portion of the adaptive filter 10. The weight adjust circuit 34 operates on the delayed signal $\Delta d(k)$ and the error signal $e(k)$ to produce a weight adjustment signal $a(w)$ which is supplied to the FIR filter 33. The circuit operates to produce the wide band output signal and the narrow band output signal as noted above.

Referring now to FIG. 5 there is shown an implementation of the circuit using the infinite impulse response (IIR) filter networks 41 and 42. Again, the input signal is supplied to an A/D converter 30 to produce the primary signal $d(k)$ which is supplied to delay network 32 and combiner circuit 31. In this case, the output of delay circuit 32 is supplied to an input of IIR forward filter 41 and to the forward weight adjust circuit 44. The output of IIR forward filter 41 is supplied to combining circuit 43. The output of combiner circuit 31 is connected to an input of D/A converter 35 and to inputs of the feedback weight adjust circuit 45 and the forward weight adjust circuit 44. The feedback weight adjust circuit 45 supplies a signal to IIR feedback filter 42 which is also connected to receive an output of combining circuit 43. As well, IIR feedback filter 42 supplies an input signal to combining circuit 43. This circuit is a special case of the adaptive filter 10 which has the distinct property of providing poles and zeros in the filter transfer function whereas the FIR configuration supplies only zeros.

Referring now to FIG. 6, there is shown, in greater specificity, a digital adaptive filter line using an FIR. Again, an A/D converter 30 is used to convert the input signal to the digital signal $d(k)$ which is supplied to delay circuit 51 and to combiner circuit 31. In the particular case, delay network 50 is indicated to have a delay time of T which is related to the circuit operation. It has been found that this delay should provide appropriate decorrelation of the input signal $d(k)$ and the delayed signal $\Delta d(k)$. It may be of duration T or a multiple thereof, e.g. nT. The output of delay 50 is supplied to other delay networks 51-1, 51-2 through 51-L which are connected in series but have separate delay line taps between the respective circuits. (Of course, a tapped delay line circuit can be utilized rather than a plurality of separate discrete circuits.) Each of the taps is connected to supply an output signal $z_l(k)$ where l varies from 1 to L, and wherein L is the maximum number of delay line taps. The signals $z_l(k)$ are supplied to the weight adjust circuits 52-1 through 52-L. The signals $z_l(k)$ are also supplied to associated multipliers 55-1 through 55-L.

The outputs of the weight circuits W1, W2 ... WL provide the output signal $w_iZ_i(k)$. Thus, each of the weight circuits produces a separate weighted output signal. All of these weighted signals are supplied to combiner circuit 53 where the signals are summed together to produce the output signal y(k). This signal is supplied to any desirable output circuit such as the D/A converter, as well as to an input of combiner circuit 31. The signal y(k) is negated and algebraically added to the primary signal d(k) to produce the error signal e(k). This error signal is supplied to output D/A converter 35, as well as to the single $\mu$ scale circuit 54. The single $\mu$ scale circuit is connected to each of the multipliers 55-1 through 55-L which then produce the individual weight signals W1 through WL. The weight signals are supplied to the respective weighting circuits 52-1 through 52-L to selectively adjust the weighting circuits. This adjustment varies the output signal z(k) supplied by the respective delay line taps. It is seen that adjustments can be made to the weighting factors of the adaptive filter 10. However, each of these weighting factors is modified by the same scaling factor $\mu$ provided by $\mu$ circuit 54. Thus, the adjustment in the weighting circuits is controlled by the same scaling factor, irrespective of the circuit operation. Consequently, the convergence of the signal e(k) will occur at a rate which is determined by the single factor $\mu$. Thus, if $\mu$ is relatively small, the convergence factor will be very slow and the residual error will be small. Conversely, if $\mu$ is quite large, the convergence rate will be rapid but the residual error will be relatively large.

Referring now to FIG. 7, there is shown a functional diagram (flow chart) of the operation of the circuit. The initial description of this Figure will be in general terms and then will be related to the circuit of the instant invention as shown and described hereinafter.

The operation begins with a start-up wherein the entire circuit is initialized. That is, an initial (sometimes relatively large) value of $\mu$ is inserted. Also, counter circuits are zeroed as described hereinafter. Thereafter, a time index of "1" is inserted into the system. A filter output signal y(k) is obtained from a summing circuit which sums the products of all the multipliers associated with the filter. The filter output signal y(k) is subtracted from the input signal d(k) so that the error signal e(k) is produced. The error signal is supplied to and operated upon by the error threshold detector. Depending upon the size of the error, the $\mu_i(k)$ scale factors can be initialized or not. The signal of the incremental weight update signal for the current time is compared to the sign of the output signal during the preceding time. If the sign of the update signal has not changed, an accounting thereof is obtained. If a specified number of consecutive time increments have occurred without sign changes, the scaling factors are evaluated and appropriate changes made therein.

Conversely, if the sign has changed for a particular tap, the number of sign changes is also counted and other appropriate alteration in the scaling factor is made. Ultimately, the appropriate scale factor is obtained and is applied to the weighting factor. The number of the filter tap is then incremented. If the ultimate or maximum number of filter taps has not been reached, the cycle is continued. Of course, if the end of the filter has been reached, then the next time index is incremented and the circuit operation repeats. The operation shown in FIG. 7 will become more readily apparent with reference to the following circuit descriptions.

Figure 8:
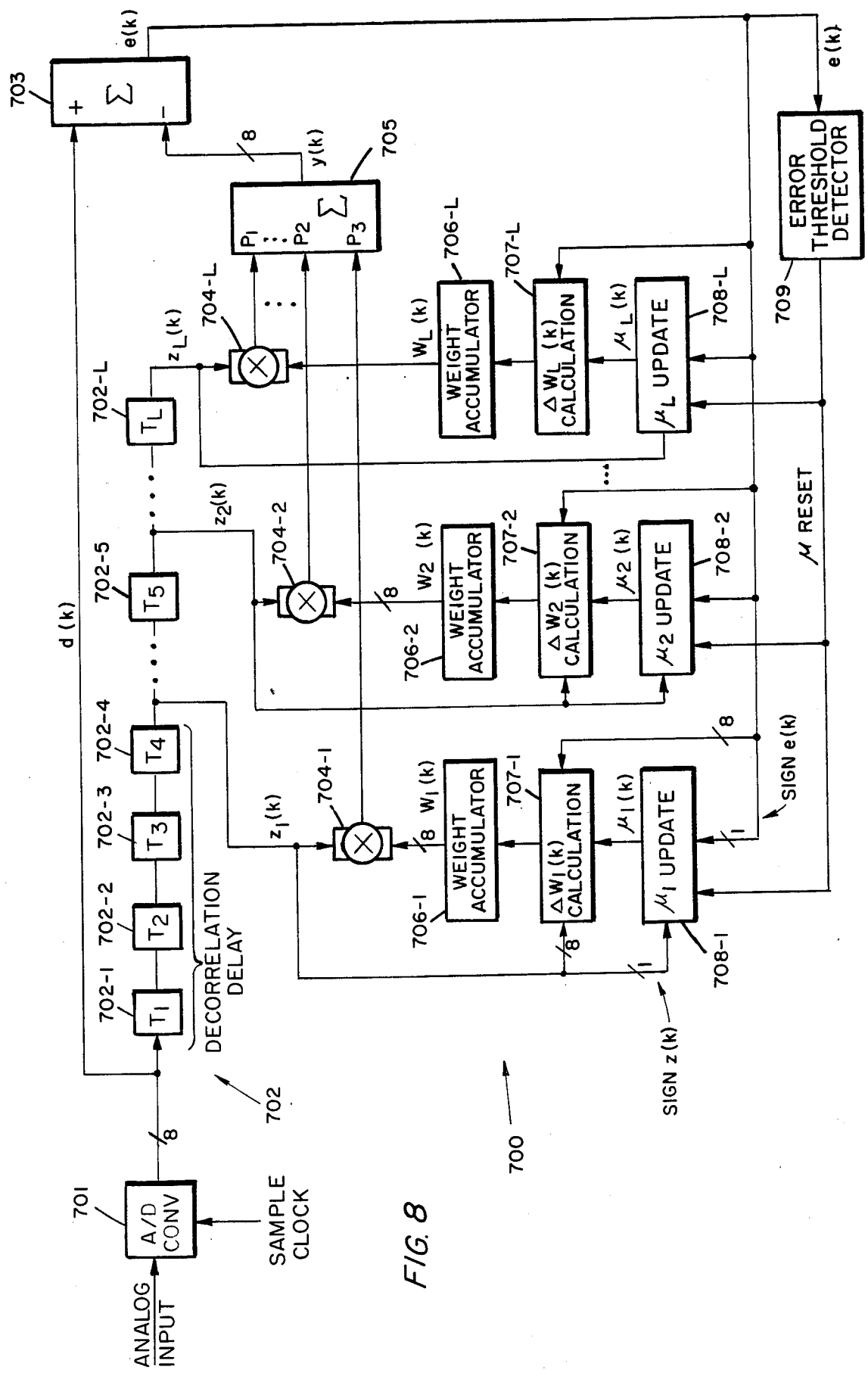
FIG. 8 is a block diagram of a preferred embodiment of the adaptive filter of the instant invention.

Referring now to FIG. 8, there is shown a block diagram of an adaptive filter in accordance with the instant invention. The particular configuration shown in FIG. 8 is for a circuit which operates in parallel. In this application, an analog input signal from an appropriate source is supplied to an analog-to-digital converter 701. At a rate which is controlled by the sample clock, the A/D converter produces an eight-bit digital signal. This signal is identified as the d(k) signal which is supplied to an input of summing network 703. The same signal is also supplied to the decorrelation delay circuit 702 which can include an appropriate number of delay networks. In this particular embodiment, there are four delay networks shown which are identified as 702-1, 702-2, 702-3 and 702-4. These delay networks can be implemented by using an appropriate shift register. In the embodiment shown here, the registers are eight-bit shift registers. The decorrelation circuit 702 produces, at the output thereof, the decorrelation signal $z_1(k)$. This signal is supplied to an input of a further delay network or shift register 702-5 and, as well, to one input of multiplier 704-1. The other input of multiplier 704-1 is provided by weight accumulator circuit 706-1. This signal is identified as $W_1(k)$ which will be described subsequently.

The delay register 702-5 also produces an output signal at the output terminal thereof. This output signal is $z_2(k)$ which is supplied to one input of multiplier 704-2 The other input of the multiplier is supplied by a further weight accumulator 706-2.

The input signal continues to propagate through the remainder of the delay line until the last tap $T_L$ or register 702-L is reached. This delay circuit portion produces the output signal $z_L(k)$ which is supplied to multiplier 704-L. The other input signal to the multiplier is provided from the weight accumulator 706-L and is designated by the signal $W_L(k)$.

It is seen that the output of each of the multiplier circuits 704-1 through 704-L is connected to the summing network 705 where all of the signals $P_1$ through $P_L$ are summed. The summing circuit 705 produces the filtered output signal y(k) which is comprised of the most significant eight-bits of the signals supplied to summing sircuit 705. This signal is an eight-bit signal also and is supplied to another input of summing network 703. The summing network 703 produces an output signal e(k) which is referred to as the "error" signal. The "error" signal e(k) represents the algebraic sum of the signals d(k) and y(k), i.e. e(k)=d(k)-y(k), and, in this embodiment, is also an eight-bit signal.

The entire error signal e(k) is supplied to the error threshold detector 709 as well as to weight change calculation networks 707-1 through 707-L. The sign-bit of the error signal is also supplied to the $\mu$ update circuits 708-1 through 708-L. The output of the error threshold detector 709 is also supplied to each of the $\mu$ update circuits as well. Moreover, the delayed signal $z_n(k)$ is supplied to the respective weight change calculation circuits 707-1 through 707-L, while the sign bit of the $z_n(k)$ signal is supplied to the respective $\mu$ update circuits 708-1 through 708-L.

Very briefly, the operation of the circuit is that the analog input signal, which may be voice signal or the like, which includes a desired signal and an undesired signal portion is supplied to the A/D converter 701. In accordance with the sample clock rate, the digital signals are output from the converter 701 and supplied to the summing network 703 and to the delay network 702. The decorrelation portion 702 is utilized to separate the signals by an appropriate time delay so that a more accurate analysis thereof can be made. The samples at the output of the delay circuit become a plurality of output signals $z_l(k)$ which are supplied to the respective weighting multiplier circuits 704. The outputs of the multipliers are all added together at the summing network 705 which produces the filtered signal $y(k)$ which is supplied to summing network 703. The summing network 703 produces the error signal $e(k)$ which is analyzed by the threshold detector to produce a control signal $\mu$ Reset for the operation of the $\mu$ update network 708. In addition, the error signal is supplied to the weight calculation circuits 707 which is modified by the $\mu$ update circuit 708 to produce a variably adjustable weight signal $W_n(k)$ which is supplied to the respective multipliers. The details of these circuits are discussed hereinafter. However, it is clear that the several multipliers 704 are individually adjusted by a variable weight so that the product thereof is also variable. By utilizing individually adjustable weights (through individually adjustable scale factors), the operation of the circuit can be more accurately controlled and defined than when a single constant scale factor is used.

As noted relative to the prior art circuit shown in FIG. 6, the so-called Widrow or LMS technique provides a constant $\mu$ scale factor which is multiplied by the error for all of the taps. Consequently, the operation of the prior art circuit is limited in definition and control. By using the techniques of the instant invention the convergence rate toward a minimum error condition can be adjusted and controlled. That is, the $\mu$ scale factor can be made very large until a sign change is detected which indicates that the minimum error condition has been exceeded. This situation usually indicates that the circuit is operating in near proximity to the optimum error condition. Consequently, in order to reduce the residual error which would be crated by "hunting" around the optimum error condition, as indicated by continual changes of sign, the $\mu$ scale factor can be reduced so that the circuit operation can "home in" on the optimum error condition. By continuously reducing the $\mu$ scale factor, the swings in the error signal are reduced in magnitude. Thus, the variably adjustable scale factor for each weight permits a higher or faster convergence rate by permitting large error correction steps to take place in the initial stages. However, by being able to selectively reduce (or increase) the $\mu$ scale factor, the residual error can also be reduced. Also, as will become apparent, a sudden shift in the signal (and a consequent large error condition) can be countered by rapidly enlarging the $\mu$ scale factor.

Figure 9:
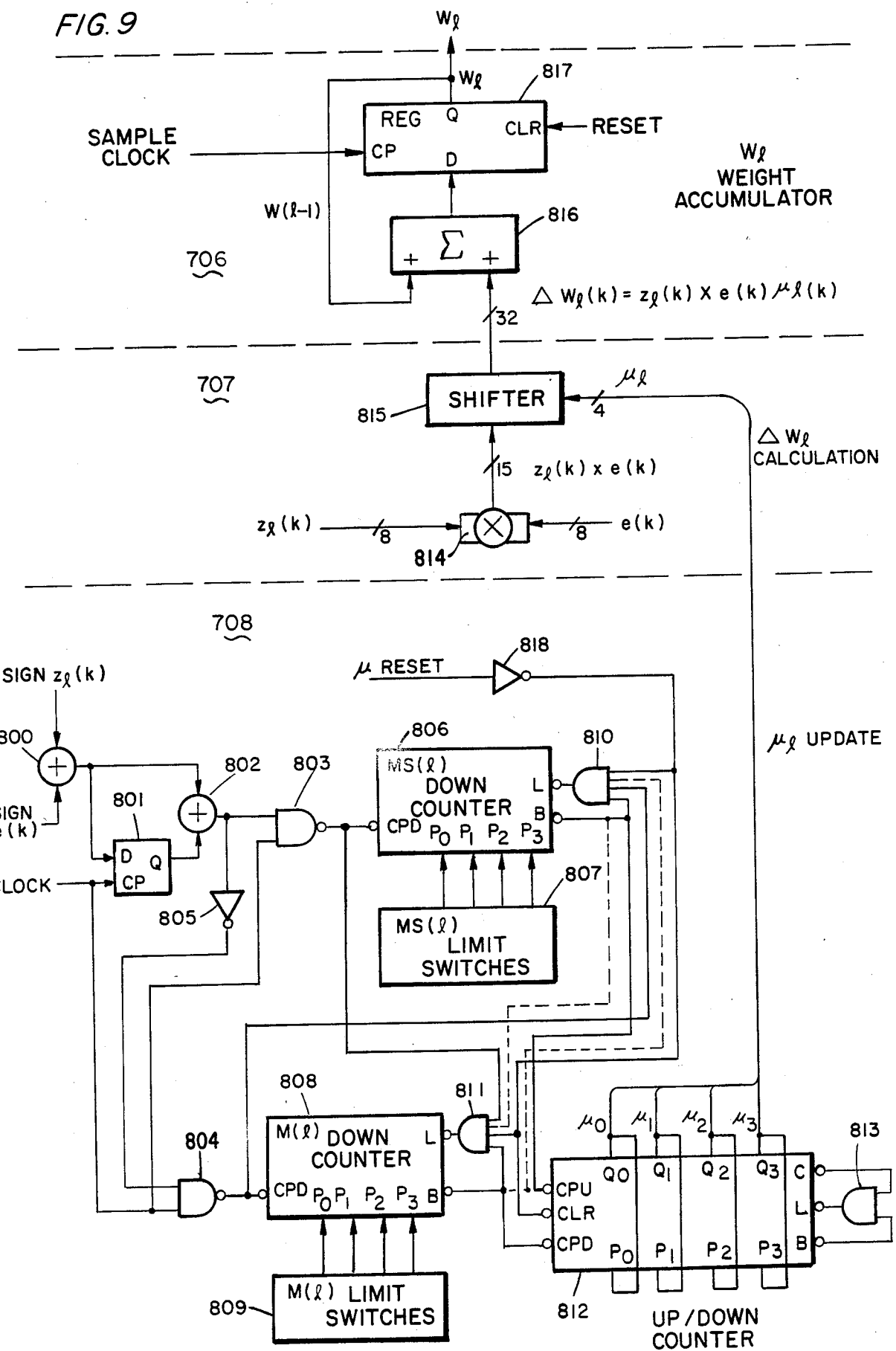
FIG. 9 is a more detailed schematic diagram of the scaling and weight update portion of the adaptive filter of the instant invention.

Referring now to FIG. 9, there is shown a more detailed, partially block, diagram of the scale factor circuitry. In particular, the circuit diagram of FIG. 9 shows the $\mu$ update circuit 708, the weight calculation circuit 707 and the weight accumulator circuit 706, as well as the interconnections therebetween. It should be understood that the circuits shown in FIG. 9 represent one channel (or line connection) in the circuit of FIG. 8. Each of the channels (corresponding to a weight or tap) shown in FIG. 8 is substantially identical in configuration and operation.

In particular, the sign-bit of the delay signal $z_l(k)$ is applied to an exclusive-OR gate 800 along with the sign-bit of the error signal $e(k)$. Basically, the exclusive-OR gate 800 operates to produce the product of the sign-bits. The output of gate 800 is connected to the D-input of flip-flop 801. When the clock signal is supplied ot the CP terminal of flip-flop 801, the output signal from gate 800 is stored at the Q output terminal of flip-flop 801 and is supplied to another exclusive-OR gate 802. The output of exclusive-OR gate 800 is also supplied to gate 802. As a consequence, the stored signal (terminal Q of flip-flop 801) represents the sign for the preceding time period while the signal from gate 800 represents the current sign signal. The operation of gate 802 is to, effectively, compare the signals and, thereby, the signs of the current and preceeding sample times. If the two input signals to gate 802 are different, it represents a change of sign in the current signal relative to the stored signal and a high output signal will result. The change of sign means that the optimum error condition has been exceeded.

In particular, if a difference is detected at gate 802, a high level signal is produced. This high level signal is provided to an input of NAND gate 803 and is inverted by inverter 805 which thereby produces a low level signal at an input of NAND gate 804. NAND gates 803 and 804 operate in typical fashion to produce a high level output signal in response to any low level input signal or to produce a low level output signal in response to all high level input signals. Consequently, when the clock signal goes high, gate 803 produces a low level signal while gate 804 is already forced to produce a high level output signal (in response to the inverted high level signal from gate 802). The low level signal from gate 803 is supplied to an input of MS(l) down counter 806 and to an input of AND gate 811. In similar fashion, the high level signal from gate 804 is supplied as a negative clock pulse at the clock terminal of M(l) down counter 808 and to an input of AND gate 810. Application of the high level signal to the CPD terminal of down counter 806 is operative to decrement this counter by one when the clock signal occurs. In the event that an appropriate number of signals are supplied to down counter 806 so that the counter reaches the all-zeros state, an output is provided at the B terminal of counter 806. This signal is supplied to an input of AND gate 810 and to the CPU terminal of up/down counter 812. Application of the B signal from counter 806 to counter 812 causes the $\mu$ value produced by counter 812 to increase. In addition, the signal from gate 810, which is a low level signal in response to the low level B signal, is supplied to the load terminal L of down counter 806. This causes the value of the MS(l) limit switches 807 to be loaded into counter 806 to establish a load limit value therein. The limit switches are generally located at the front panel of the circuit but can be provided in any suitable fashion. These switches are, generally, manually adjustable but can be electronically adjustable switches which permit the adjustment of the range operations of the circuit.

Referring back to gate 802, it should be noted that the absence of a sign change or difference produces a low level output signal which is supplied to gate 803 and is also inverted by inverter 805 to produce a high level input signal at gate 804.

In this case, the application of a clock signal produces a low level signal from gate 804 which is supplied to down counter 808. Counter 808 operates in a similar fashion to counter 806 and decrements one count with the application of the clock pulse. When this counter reaches the all zeroes state, a borrow signal B is supplied to AND gate 811 and to the CPD terminal of up/down counter 812. The CPD signal causes counter 812 to count down wherein the value of $\mu$ is decreased. The limit switches 809 are similar to limit switches 807 and control the operating ranges or sensitivity of the down counter 808. In addition, the signal from NAND gate 804 is supplied to AND gate 810 to load the value of the limit switches 807. This has the effect of resetting the down counter 806 to the initial value. In an alternative embodiment (shown in dashed line), the B output terminal of counter 808 is connected to gate 810 to preset the MS(l) counter 806. This embodiment will preset counter 806 only when the limit is reached by counter 808. This is similar to the operation of AND gate 811 and limit switches 809 relative to counter circuit 808. This operation by the network keeps track of the number of signs changes (or not) which occur individually or consecutively.

The up/down counter 812 produces, in this embodiment, four output signals which represent a signal of $2^{-\mu}$. These signals are combined on a bus which is connected to the weight calculation circuit 707. The combined output signal represents a value of $\mu$. These signals are shown as $\mu_0$, $\mu_1$, $\mu_2$ and $\mu_3$, which are the bit values of $\mu$. When the counter 812 counts up from zero (all output zeroes) to the maximum value of 15 (all ones), the next counter (pulse) on the input terminal CPU produces a carry output signal C at the output terminal. This signal is supplied via AND gate 813 to the load terminal which causes the Q signals (i.e. all ones) to be reloaded into counter 812. In effect, this limits the maximum count of counter 812. More importantly, it prevents the counter from "rolling over" to the next count (i.e. all zeroes) which would have the effect of dramatically altering the $\mu$ factor produced by counter 812. Of course, the same limit operation occurs in a count down mode as the result of signals supplied to the CPD terminal of the counter.

The output signal of counter 812 is referred to as the $\mu_l$ update signal and is supplied to the weight calculation circuit. In particular, the $\mu_l$ signal (in this case a four-bit signal) is supplied to shifter 815. In addition, the weight calculation circuit 707 receives the lth delay signal $z_l(k)$ and the error signal $e(k)$ as shown in FIG. 8. These signals are supplied to multiplier 814 where they are multiplied together and the most significant fifteen bits are supplied to shifter 815. Shifter 815 shifts the information toward the least significant bit (LSB) by the number of bits represented by u(l). This shift has the effect of multiplying the information by $2^{-\mu}$. The shifter then produces a thirty-two-bit output signal which is representative of the change in weight calculated as a function of the delayed signal, $z_l(k)$, the error signal, $e(k)$, and the scale factor, $u_l(k)$.

The weight change signal is supplied to summing circuit 816 which produces an output signal which is supplied to register 817. With the application of a sample clock signal to the CP terminal of register 817, the signal from summing circuit 816 is stored in register 817 and output therefrom as the weight or $w_l$ signal. The $w_l$ signal is also returned to an input of summing circuit 816. This has the net effect of returning the previous value of the weight signal and adding it to the current change in weight signal. Thus, the previous weight signal and the current weight change signal are added together. The result is supplied to register 817 where it is stored as a new weight signal. Consequently, the weight signal can be updated on a substantially real-time basis. The weight signal $w_l$ is then supplied to multiplier 704 as shown in FIG. 8. Consequently, it is clear that the $\mu$ value can be scaled up or down as a function of the sign changes in the product of the error signal and the delay signals. The weight values can be modified in accordance with the $\mu$ scale factor as well as the values of the delay and error signals. Consequently, it is seen that the weight adjustment can be varied by the error and delay filter signals and it can be further varied by the $\mu$ factor which is also variable. In essence, the circuit then provides a variation on a variable which is, in effect, a second derivative variation of the adaptive filter circuit.

In the circuitry shown in FIG. 9, the register 817 includes a reset signal which clears register 817. This reset signal is usually supplied during power-up or initialization procedures.

The $\mu$ update circuit also includes a $\mu$ reset signal which is supplied via inverter 818. The $\mu$ reset signal is supplied by the error threshold detector (see FIG. 10). This signal signifies that a current error signal which is greater than the previous error signal by a certain amount, is present. This signal then automatically resets the respective counters to the initial value (which, in some applications, is a maximum value thereby to increase the value of $\mu$ and, thus, the convergence rate. This situation can occur when an unusual condition exists such as an unexpected overshoot on the error signal or by a shifting of the signal pattern presented to the circuit.

Figure 10:
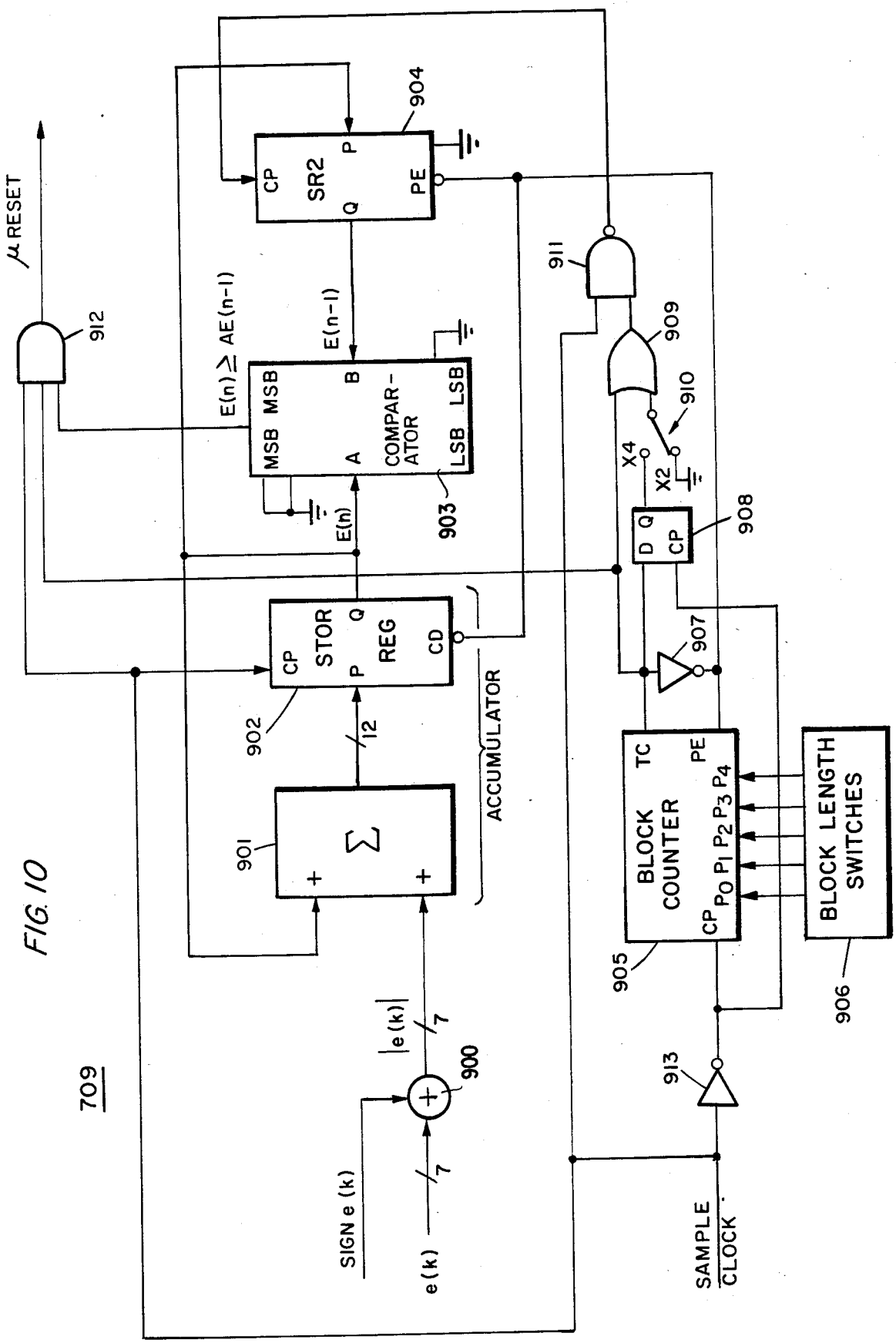
FIG. 10 is a schematic diagram of the error threshold detector portion of the instant invention.

Referring now to FIG. 10, there is shown a more detailed block and schematic diagram of the error threshold detector 709 shown in FIG. 8. In this circuit, the full error signal $e(k)$ is supplied to exclusive-OR gate 900 along with the signal bit of the error signal $e(k)$. This has the effect of converting the two's complement error signal into an absolute magnitude signal which is the output of the exclusive-OR gate 900. The seven bit magnitude signal $|e(k)|$ is suppied to one terminal of summing network 901. The output of the summing network 901 is connected to the input of a storage register 902. The output terminal of storage register 902 is returned to an input of summing network 901. Consequently, the output of the storage register is added to the magnitude of the input error signal and returned to, and stored in, storage register 902. This has the effect of accumulating and updating the magnitude of $e(k)$.

The output of register 902 is further connected as one input of comparator 903. Another input of comparator 903 is supplied by storage register 904. The input of storage register 904 is connected to the output of storage register 902. The storage registers are both clocked by the Sample Clock supplied to the CP terminals thereof. It is clear that the value stored in storage register 904 effectively represents the cumulative error signal denoted as E(k) at the previous (n−1) clock pulse while the signal stored in storage register 902 represents the current (n) error signal. The signals are compared by comparator 903 and an output signal representative thereof is supplied to AND gate 912.

It will be noted that the most significant bit of one input and the least significant bit of the other input of comparator 903 are connected to ground. This has the net effect of shifting the signals supplied by the respective storage registers. Depending upon the number of bits connected as shown, the shifting can represent a two- or four-fold shift in the ratio of the compared signals. Thus, the comparator can be arranged to compare the current cumulative error signal $E(k)$ with the previous cumulative error signal $E(k-1)$ or twice $E(k-1)$ or four times $E(k-1)$ or, potentially, other integer or fractional multiples of $E(k-1)$. Of course, many combinations can be achieved in accordance with the desired circuit operation. Nevertheless, the output of comparator 903 is connected to an input of AND gate 912 to activate the AND gate when the specified comparison occurs. For example, if the threshold in the comparator is set at twice $E(k-1)$, and $E(k)$ is greater than or equal to twice $E(k-1)$, than the $\mu$RESET line is activated insofar as the comparator output is concerned. Another input of AND gate 912 is connected to receive the Sample Clock pulse in order to synchronize the operation of AND gate 912 with the remainder of the circuit.

Block counter 905 is connected to receive Sample Clock pulses via inverter 913. The count signal produced by counter 905 establishes the count of the number of samples which are to be accumulated for comparison. The block length switches 906 are set to establish the desired block length for the circuit. The counter 905 then counts the number of Sample Clock pulses supplied thereto until the contents of counter 905 is all ones. Thus, it is seen that the block length switches 906 can be used to alter the initial contents of counter 905 and, thus, the number of samples obtained. when the counter 905 reaches the "all ones" status, a terminal count signal at the TC terminal is provided. This signal is supplied to the D input terminal of flip-flop 908 and, via inverter 907, to the parallel entry terminal PE of counter 905. The signal at the parallel entry terminal causes the value of the block length switches 906 to be entered into counter 905. This number may be the same as previously or it may have been altered in the meantime. In addition, the TC count is supplied to AND gate 912 to enable gate 912 if the other signals applied thereto are appropriate. In addition, the TC pulse is supplied to the input of OR gate 909. The output of OR gate 909 is connected to one input of NAND gate 911 which also receives the Sample Clock signal. The output of NAND gate 911 is connected to the clock pulse terminal CP of storage register 904. The PE terminal of register of 904 is simultaneously activated for one clock period to permit storage of the current accumulated error signal.

The output of flip-flop 908 is connected to the times-four terminal (X4) of switch 910. The times-two terminal (X2) is connected to ground. That is, when switch 910 is connected to the X2 position, flip-flop 908 has no effect and the comparator 903 produces the X2 effect because of the wired-in configuration described above.

When switch 910 is connected to the X4 position, a one clock period delayed TC signal is applied to OR gate 909. This supplies a second clock pulse to storage register 904 after the PE signal has been removed. With no PE signal applied, the data contained in register 904 will be shifted up one bit in the direction of the most significant bit (MSB). This shift, combined with the shift in the comparator, produces a four-fold multiplication factor for the threshold comparison of $E(k)$ with four times the previous error signal, i.e. $4 \times E(k-1)$.

It should be noted as well, that the output of inverter 907 is supplied to the parallel enable input of storage register 904 and to the synchronous clear terminal CD of storage registe 902. The register 902 is a "synchronous clear" type register so that when the CD (clear direct) input terminal is switched low, the output signals at the Q terminals are switched to zero in response to the positive going (trailing edge) of the clock signal. This action is effective to reset the storage register 902 and, thus, the accumulator circuit portion.

Figure 11:
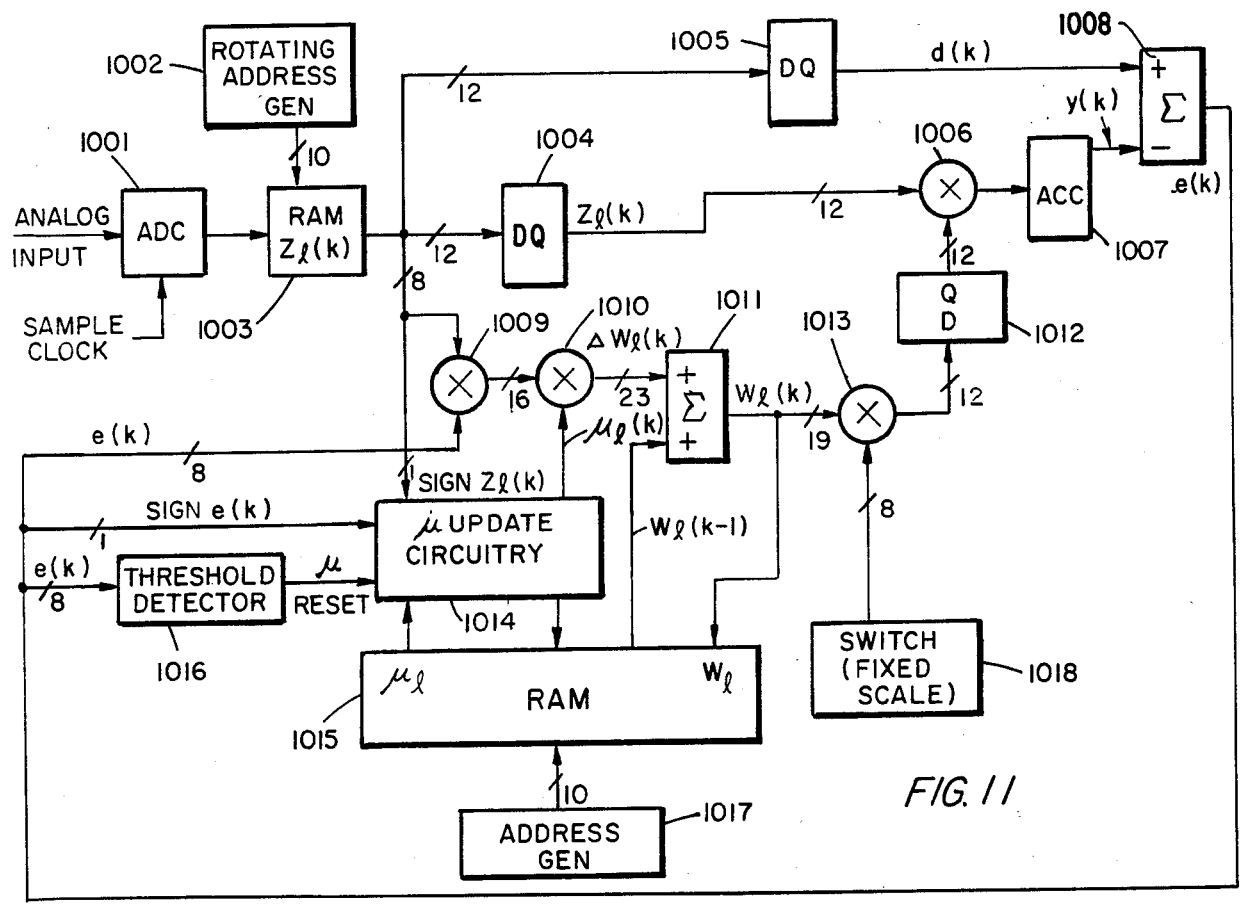
FIG. 11 is a block diagram of a serial version of the adaptive filter using the techniques of the instant invention.

Referring now to FIG. 11, there is shown another embodiment of the instant invention. This particular embodiment is a serial operating adaptive filter which uses the inventive operating concepts noted above. It will be seen that much of the operation of the FIG. 11 embodiment is similar or identical to the operation of the FIG. 8 embodiment. However, in the embodiment of FIG. 11, the weight updates, $\mu$ updates, and so forth, are performed serially for each signal, or equivalent of a filter tap, as compared to the parallel operation of the FIG. 8 embodiment. That is, in the serial mode each tap or node in the delay line (or effective delay line) is calculated as before. However, the calculated numbers are then stored in a memory. The circuit then proceeds to the next operation, calculates the appropriate numbers for the next tap and places that information in a memory address. By rotating the address through the RAM, the taps are, effectively, scanned.

In this case, the analog signal is supplied to the analog-to-digital converter 1001. A Sample Clock signal is supplied thereto to effect the operation thereof. The output of converter 1001 is supplied to a selected address in RAM 1003 where the address is selected by the rotating address generator 1002. The use of the rotating address generator permits information to be stored in a particular location in the RAM. A subsequent operation will take place using the information at that address; however, the address will have been incremented so as to relate to a different location—as if the information had propagated through a delay line. By using the rotating address generator, the time, expense and effort of moving the contents of a memory location to a different memory location are avoided.

In evaluating the information in RAM 1003, the oldest data is utilized first, in the nature of a first-in, first-out (FIFO) device. The output information from the RAM is supplied to the D-inputs of storage registers 1004 and 1005, as well as to one side of multipliers 1009. The sign bit of the particular information from RAM 1003 is also supplied to the $\mu$ update circuitry 1014. The $\mu$ update circuit also receives the sign bit of the error signal e(k) from summing network 1008. The $\mu$ update circuitry 1014 operates on these two signals, as well as the other signals supplied thereto, to operate in a fashion which is very similar to the $\mu$ update circuitry described in the parallel operating embodiment. When the $\mu$ update information has been determined, the information will be returned to and stored in RAM 1015 to provide the next operation with the $\mu$ values.

After the $\mu$ value has been updated, the weight value is supplied to multiplier 1010 which receives another input from multiplier 1009. The multiplier 1010 then produces the change in the weight value which is supplied to summing network 1011. The RAM 1015 supplies the weight value from the preceding sample period to summing network 1011. The summing network combines these two values and returns the new value of the weight to RAM 1015 to be stored therein for use in the next sample period. In addition, the output of summing network 1011 is supplied to multiplier 1013 which receives a fixed $\mu$ factor from a fixed scale switch 1018. The switches 1018 are, typically, front panel switches such as those described previously. The output of multiplier 1013 is supplied to a storage register 1012 which provides a signal to multiplier 1006. The updated and scaled weight value supplied to multiplier 1006 from register 1012 is multiplied by the delay signal $z_j(k)$ from shift register 1004. The output of multiplier 1006 is supplied to accumulator 1007 and stored therein. While this action is occurring, the subsequent $\mu$ update and weight update can be occurring in the portions of the circuit previously described. When each of the signals has been evaluated and updated, the accumulator 1007 is activated and produces the y(k) signal which is suppied to summing network 1008 and combined with the primary signal d(k) to produce a new error signal e(k) which is fed back to the circuit to produce subsequent information. Moreover, at that time, the rotating address generator 1002 continues to selectively address the RAM storage 1003. This is accomplished by noting that the address generator 1002 will have been incremented by one wherein new contents are retrieved from the old addresses. In other words, it may be considered that the oldest data word stored in the RAM is effectively discarded because it is no longer retrieved.

By selecting the information from the next address, a new d(k) signal is supplied and a new e(k) signal is derived. Thus, a new error signal is supplied to the circuit for further operation. This operation continues until each of the addresses has been tested and updated. At that point, the entire operation is recycled with the rotating address generator having been incremented to a recycling position.

Figure 12:
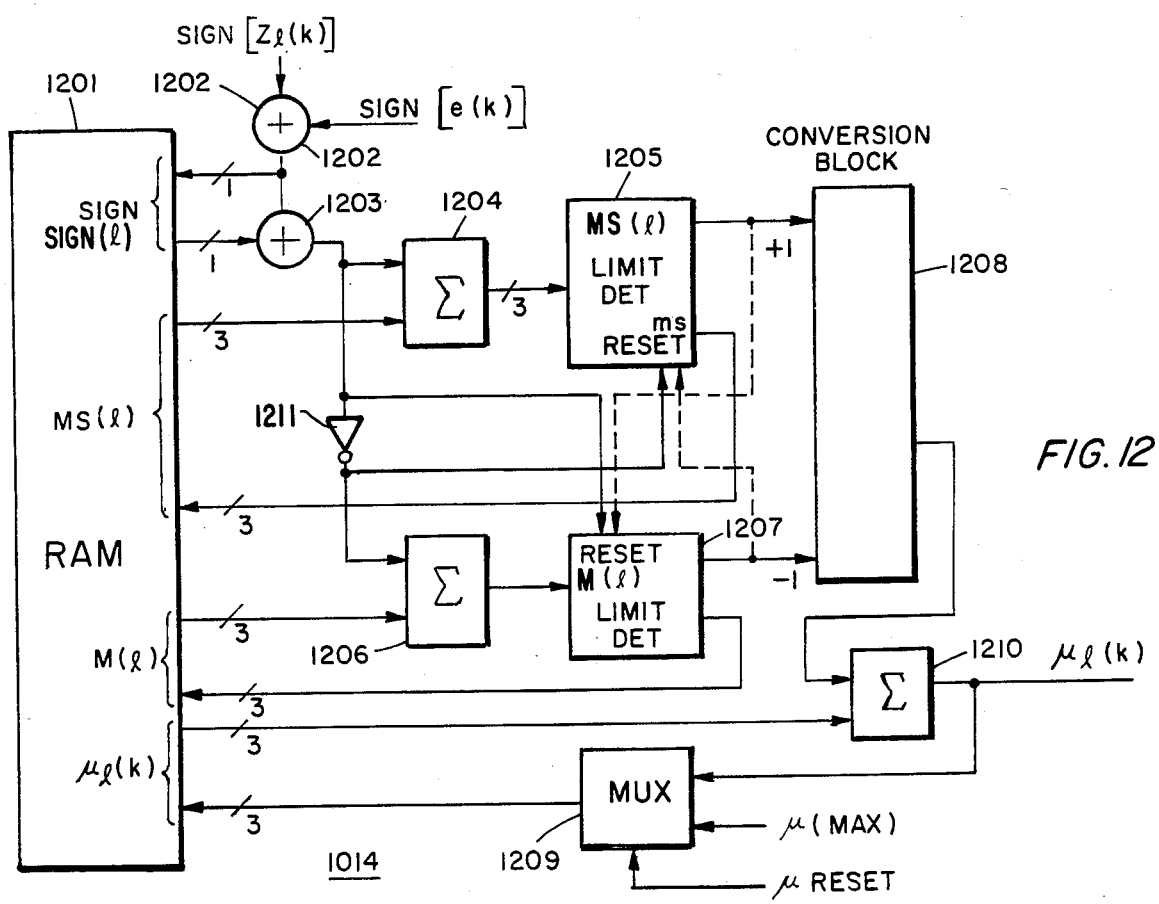
FIG. 12 is a block diagram of the μ update portion of the circuit embodiment shown in FIG. 11.

Referring now to FIG. 12, there is shown a more detailed block diagram of the $\mu$ update circuit portion of FIG. 11. Again, the sign bit of the filter signal $z_j(k)$ and the sign bit of the error signal e(k) are supplied to exclusive-OR gate 1202, to multiply the signs of $z_j(k)$ and e(k) as previously discussed relative to FIG. 11. The output of gate 1202 is supplied to the sign (l) input terminal of RAM 1201, as well as to an input of exclusive-OR gate 1203. The other input of gate 1203 is the signal (l) output terminal of RAM 1201. The output of RAM 1201, in this case, represents the value of the sign (l) signal for the preceding sample.

The output of OR gate 1203 is supplied to an input of summing network 1204, the reset terminal of the M(l) limit circuit 1207, and, via inverter 1211, to an input of summing network 1206 and the reset terminal of the MS(l) limit circuit 1205. If a sign change has been detected by exclusive OR gate 1203, the output signal will be a high level signal supplied to the summing circuit 1204 and limit detector 1207, while a low level signal will be supplied to summing circuit 1206 and limit detector 1205.

The other input to summing circuit 1204 is the MS(l) output of RAM 1201. Thus, the value of MS(l) of RAM 1201 will be incremented by one, at summing circuit 1204, and a new value will be set in MS(l) circuit 1205. Again, the limit circuits 1205 and 1207 can have the manually set limits M0 and M1, respectively, applied by the limit switches. The limit circuits compare the limit switch with the count from the appropriate summing circuit, in this case, summing circuit 1204. If the limit is met or exceeded, the limit circuit 1205 will send a +1 signal to conversion circuit 1208. In addition, the MS(l) output of limit detector 1205 is returned to RAM 1201 and stored therein as the new MS(l) signal. This signal will have a value of zero if the limit has been reached or will have the value of the output of summing circuit 1204 if the limit has not been reached.

If the output of gate 1203 is low, a high level signal is supplied to summing circuit 1206 which is added to the M(l) signal in RAM 1201. This summed signal is supplied to limit circuit 1207 which operates in a fashion similar to circuit 1205. However, if the limit at circuit 1207 is reached, a −1 signal is supplied to conversion circuit 1208. Also, the output of limit circuit 1207 is returned to RAM 1201 for storage therein for the next operation. The reset terminals of circuits 1205 and 1207 are connected to opposite sides of inverter 1211. Thus, if a high signal is supplied by gate 1203, limit circuit 1205 is incremented by summing circuit 1204 but limit circuit 1207 is reset to zero. Conversely, if gate 1203 produces a low level signal, summing circuit 1206 increments limit circuit 1207 and limit circuit 1205 is reset by the positive output signal from inverter 1211.

Another configuration for the MS(l) and M(l) reset is shown (in dashed lines) connecting the limit output of detector 1205 to the reset input terminal of detector 1207 limit and reset. The corresponding connections are made between detectors 1205 and 1207 terminals, respectively. The connections of the reset terminals to inverter 1211 are, of course, not required in this configuration. With this arrangement, detector 1205 is reset externally only when M(l) reaches its limit. Also, detector 1207 is reset externally only when MS(l) reaches its limit.

Thus, it is seen that if limit circuit 1205 detects a signal which is equal to or greater than the limit a +1 signal is supplied to conversion circuit 1208. Limit circuit 1207 is operative to supply a −1 signal to conversion circuit 1208 if the limit thereof is detected. In the event that neither of the limits is reached, a 0 is supplied to conversion circuit 1208.

The output of conversion circuit 1208 is supplied to summing network 1210 and provides the controlling factor for the $\mu_j(k)$ update. That is, the output signal from conversion circuit 1208 is summed with the contents of the $\mu_j(k)$ address in RAM 1201. The updated information from summing circuit 1210 is then submitted to multiplier 1010 as shown in FIG. 11 and is, also, returned to RAM 1201 via MUX 1209. Another input to MUX 1209 is the initial $\mu$ signal which, for some applications, represents the maximum value for $\mu$. In the event that a special or unusual circumstance is detected, as described above, the $\mu$RESET signal is provided to MUX 1209. With the application of the $\mu$RESET signal, the $\mu$ value is transmitted through the MUX to RAM 1201 and stored therein.

Figure 13:
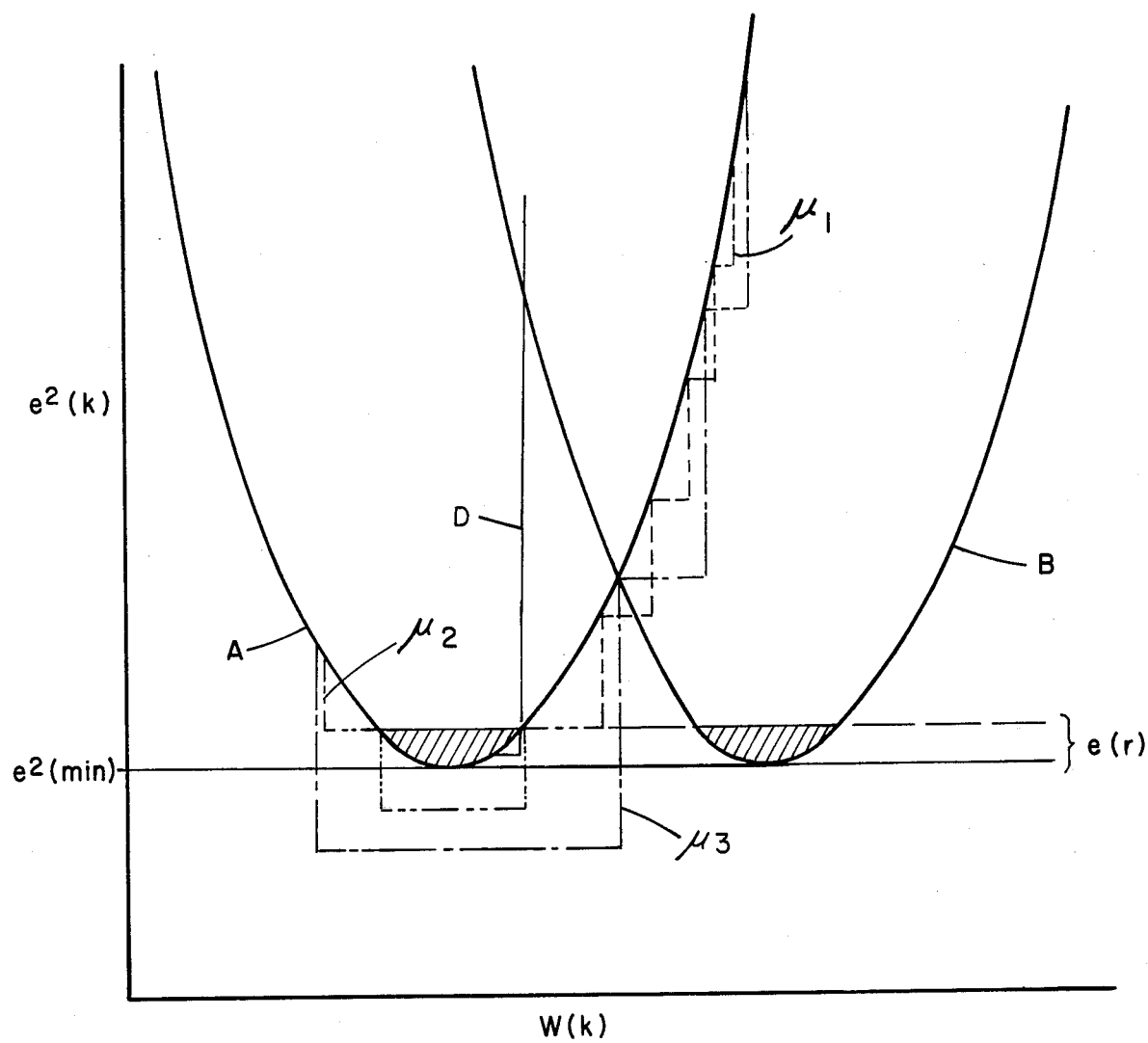
FIG. 13 is a graphic representation of the convergence operation of the circuits shown and described herein.

Referring now to FIG. 13, there is shown a graphic representation of the operation of the inventive circuit. In particular, curve A represents the signal plot for the error signal. Curve B represents the same signal when modified by a noise shift.

The dashed line represents the operation of the prior art circuit. That is, with a fixed value of $\mu$, the convergence towards the $e^2(min)$ signal follows a fixed rate progression. Eventually, the error signal will pass through the $e^2(min)$ value and reverse its polarity (i.e., sign). The signal will then converge from the other side of the curve. However, with the fixed $\mu$ value, a certain residual error e(R) is inevitable. In the prior art, the value of $\mu$ and the value of e(R) are interrelated. That is, if $\mu$ is made large in order to increase the convergence rate, the value of e(R) will also be relatively large because of the "hunting" around the $e^2(min)$ signal.

Contrariwise, in the instant invention, the value of $\mu$ is variable. This permits the system to use a large value of $\mu$ until a sign change is detected. At that time the value of $\mu$ can be reduced by a specified amount. Again, further sign changes in the error signal value can be detected in order to further vary the size of $\mu$. In this manner, when a large error signal is detected, no sign changes occur and a large value of $\mu$ is used to speed convergence. However, reducing the value of $\mu$ when sign changes are detected permits a smaller residual error to be achieved. Thus, the system of the instant invention can converge more rapidly than the prior art. Once the error convergence has been accomplished, the present system can operate at a slower rate but with the net result that a smaller residual error is achieved.

As noted, curve B represents the same error signal shifted by noise or the like. The faint vertical line D between the curves shows how the system "jumps" from curve A to curve B. If both systems (prior art and present) are at the same point on the respective curves, the present system is still, generally, superior. That is, the present system can detect the sign changes (or lack thereof) and, again, alter the value of $\mu$. In this case, the instant invention would increase $\mu$ because of a number of no-sign changes occurring. Therefore, if the new curve position represents a number of no-sign changes which corresponds to a large error condition, the present system can revert to a large value of $\mu$ and converge rapidly again.

Thus, there has been shown and described an improved adaptive filter system. The present system can provide improved operation because of its variable value of $\mu$. That is, if the $\mu$(new) of the invention is greater than the $\mu$(old) of the prior art, the new system will converge more rapidly than the prior art but have greater residual error. Conversely, if $\mu$(new) is less than $\mu$(old), the instant circuit will converge more slowly but have lower residual error than the prior art systems. However, the present invention has the capability of changing the value of $\mu$ in accordance with the operational conditions so as to have large $\mu$ when needed for rapid convergence and small $\mu$ when needed for low residual error thereby clearly exceeding the operation of the prior art circuit.

While certain specific arrangements of the circuit are shown and described, it is clear that portions thereof can be modified without departing from the inventive teachings set forth herein. Any such modifications which fall within the purview of this description are intended to be included therein as well. The description is intended to be illustrative only and is not intended to be limitative. The scope of the invention is limited only by the claims appended hereto.

Having thus described a preferred embodiment of the invention, what is claimed is:

1. Adaptive filter means comprising:
   input means for supplying an input signal,
   decorrelation means connected to said input means for producing a decorrelated signal,
   filter means for providing a filtered output signal,
   combining means for combining said input signal and said filtered output signal to produce a control signal,
   first scaling means connected to said combining means to receive said control signal and to said decorrelation means to received said decorrelated signal in order to produce a first scaling signal, and
   second scaling means connected to receive said control signal and said first scaling signal in order to supply a second scaling signal to said filter means to alter the operating characteristics thereof.

2. The system recited in claim 1 wherein,
   said filter means comprises,
   a plurality of weighting circuits for altering the operation of said filter means.

3. The system recited in claim 1 wherein,
   said filter means includes weight calculating means adapted to receive said error signal and to produce a weight adjustment signal.

4. The system recited in claim 3 wherein,
   said filter means includes a weight accumulating means adapted to receive said weight adjustment signal and to produce a total weight adjustment signal.

5. The system recited in claim 1 wherein,
   said filter means includes scale factor update means adapted to receive said error signal and to produce a variable scale signal.

6. The system recited in claim 1 wherein,
   said decorrelation means comprises delay means for delaying said input signal to produce said decorrelated signal.

7. The system recited in claim 1 wherein,
   said filter means includes multiplier means connected to receive said decorrelated signal a nd said second scaling signal and adapted to produce said filtered output signal.

8. The system recited in claim 1 wherein,
   said input means includes an analog-to-digital converter means.

9. The system recited in claim wherein,
   said first scaling means includes detector means for detecting changes in the sign of said control signal.

10. The system recited in claim 9 wherein,
    said first scaling means includes counter means for counting the changes in the sign as detected by said detector means.

11. The system recited in claim 10 wherein,
    said counter means includes down counter means for producing a signal when a specified count is reached thereby to indicate a prescribed system condition.

12. The system recited in claim 9 wherein,
    said detector means operates to alter the scale factor of said first scaling means in response to a signal from said detector means.

13. The system recited in claim 1 wherein,
    said first scaling means includes range selector means for establishing limits on the range of a scale factor in said scaling means.

14. The system recited in claim 1 including,
    error threshold detector means adapted to receive said control signal and to establish the magnitude of said control signal over a specified time period.

15. The system recited in claim 1 wherein,
    said input means includes a rotating address generator, and
    a memory unit connected to said generator.

16. The system recited in claim 15 wherein,
    said memory unit includes a plurality of memory address locations which correspond to different portions of said decorrelation means so that said memory unit can serially produce said decorrelated signal in response to activation by said rotating address generator.

17. The system recited in claim 16 including, accumulator means connected between said memory structure and said combining means, said accumulator means operative to store signals representative of the scaling signal currently stored in said memory structure as modified by said filtered output signal.

18. The system recited in claim 17 including, scale switch means connected to supply a fixed scale factor to said accumulator means.

19. The system recited in claim 1 wherein, at least one of said first and second scaling means is formed by a memory structure.

20. The system recited in claim 19 wherein, said memory structure (1015) stores said first scaling signal and selectively supplies said first scaling signal to said combining means (1008) whereupon said first scaling signal in selectively altered by said control signal and the altered first scaling signal is stored in said memory structure.

21. The system recited in claim 19 including, summing means connected to receive said first and second scaling signals from said first and second scaling means and to return the sum output signal from said summing means to said memory structure.

22. The system recited in claim 19 including, address generating means connected to said memory structure which comprises a RAM.

23. The system recited in claim 1 wherein, said first scaling means includes first multiplying means (1010) connected to operate on at least portions of said first and second scaling signals, and memory means connected to receive signals from said first multiplying means.

24. A method of adaptive filtering comprising the steps of:

providing a primary signal, decorrelating said primary signal in decorrelating apparatus in order to produce a decorrelated signal, producing a reference signal which is a function of said primary signal, summing said decorrelated signal with said reference signal to produce a n-bit control signal wherein n is greater than 1, supplying said control signal to one of a plurality of variable scaling elements of a weighting network associated with said decorrelating apparatus, and supplying fewer than n bits of said control signal to another of said plurality of variable scaling elements in order to alter said decorrelated signal produced by said decorrelating step in a variably adjustable fashion as a function of said control signal.

25. The method recited in claim 24 wherein, said decorrelated signal is obtained by delaying said primary signal.

26. The method recited in claim 24 including the steps of:

supplying said control signal to a detector which determines the status of said control signal and produces a status signal representative thereof, and supplying said status signal to said another of said plurality of scaling elements.

27. The method recited in claim 24 including the step of:

supplying at least a portion of said decorrelated signal to each of said plurality of variable scaling elements.

28. A filter circuit system comprising, an adaptable weight filter means (700) comprising a plurality of weighting networks each of which is adapted to receive an input signal (z(k)), first summing means (705) connected to said plurality of weighting networks to produce a filtered output signal (y(k)), said weighting networks each having a plurality of variable scale factor means (708,707), and second summing means (703) adapted to receive a reference input signal (d(k)) and said filtered output signal (y(k)) and to produce an error signal (e(k)) which is representative of the combination of said filtered output signal (y(k)) and said reference signal (d(k)), each of said plurality of variable scale factor means in each weighting network of said filter means connected to receive at least portions of said error signal (e(k)) and at least portions of said input signal (z(k)), wherein said variable scale factors of said variable scale factor means are a function of incremental changes of said error signal produced by said second summing means and said input signal.

29. The system recited in claim 28 wherein, said variable scale factors are a function of changes of sign of said error signal.

* * * * *